United States Patent [19]
Mueller et al.

[11] Patent Number: 4,991,586
[45] Date of Patent: Feb. 12, 1991

[54] METHOD FOR MONITORING VASCULAR FLOW USING MAGNETIC RESONANCE SIGNALS

[75] Inventors: Edgar Mueller; Gerhard Laub, both of Heroldsbach, Fed. Rep. of Germany

[73] Assignee: Siemens Aktiengesellschaft, Berlin and Munich, Fed. Rep. of Germany

[21] Appl. No.: 393,897

[22] Filed: Aug. 15, 1989

[30] Foreign Application Priority Data

Aug. 16, 1988 [DE] Fed. Rep. of Germany ....... 3827800

[51] Int. Cl.⁵ ............................................. A61B 5/055
[52] U.S. Cl. ................................ 128/653 AF; 324/306
[58] Field of Search ................. 128/653 AF; 324/306, 324/309

[56] References Cited

U.S. PATENT DOCUMENTS

| | | | |
|---|---|---|---|
| 4,602,641 | 7/1986 | Feinberg | 128/653 AF |
| 4,694,253 | 9/1987 | LeRoux | 324/309 |
| 4,718,424 | 1/1988 | Nishimura | 324/306 |
| 4,769,603 | 9/1988 | Oppelt et al. | 324/309 |
| 4,782,839 | 11/1988 | Hennig et al. | 128/653 AF |
| 4,800,889 | 1/1989 | Dumoulin et al. | 324/306 |

OTHER PUBLICATIONS

"MR Angiography with Gradient Motion Refocusing," Laub et al., Journal of Computer Assisted Tomography, vol. 10, No. 5, pp. 715–722, Sep./Oct. 1986.

*Primary Examiner*—Max Hindenburg
*Assistant Examiner*—Krista M. Pfaffle
*Attorney, Agent, or Firm*—Hill, Van Santen, Steadman & Simpson

[57] ABSTRACT

A pulse sequence is disclosed for operating a magnetic resonance system wherein a slice of the examination subject disposed perpendicularly to the flow in a vessel under examination is first selectively excited. A nuclear magnetic resonance signal is read out as an echo signal under the influence of a read-gradient disposed perpendicularly to the slice selection gradient. The signals acquired in successive steps are displayed on a time axis. In contrast to a conventional spin warp sequence, the phase coding gradient, and thus a topical resolution in one direction, are foregone, and instead a chronological resolution of the flow is achieved.

11 Claims, 6 Drawing Sheets

METHOD FOR MONITORING VASCULAR FLOW USING MAGNETIC RESONANCE SIGNALS

BACKGROUND OF THE INVENTION

1. Field of the Invention

The present invention is directed to a pulse sequence for operating a magnetic resonance system for monitoring the chronological flow within a vessel.

2. Description of the Prior Art

A number of different methods are known for executing a flow measurement in a vessel using the phenomena of nuclear magnetic resonance. These known techniques have in common the selective excitation of a slice of an examination subject which is disposed perpendicularly relative to the flow direction. During the on-time of the slice selection gradient, an additional phase is impressed on displaced spins, so that the resulting signals can be evaluated to obtain information about the flow.

It is also possible to generate an image of the examination subject in which the flow can be seen by applying further gradients. Such a method is disclosed in "MR Angiography with Gradient Motion Refocusing," Laub et al., Journal of Computer Assisted Tomography, Vol. 10, No. 5, pages 715-722, Sept./Oct. 1986. In this method, as in standard imaging methods, three orthogonal gradients are used, namely a slice selection gradient, a read gradient and a phase coding gradient. The phase coding gradient is forwarded from scan to scan as in the standard spin warp method, so that a full topical resolution is achieved. Using this method, however, relatively long examination times are required to display the chronological course of the flow.

The portrayal of the chronological course of a flow is of significant diagnostic value. In conventional methods, this course can only be displayed by ECG triggering which, however, is time-consuming, and is not as useful a diagnostic tool as a real-time display.

SUMMARY OF THE INVENTION

It is an object of the present invention to provide a pulse sequence for measuring the chronological course of vascular flow using a magnetic resonance system which permits a real-time display of the flow given sufficient topical localization.

This object is achieved in accordance with the principles of the present invention in a method wherein a pulse sequence is repeated n times, the sequence including the simultaneous application of a frequency-selective RF pulse and a slice selection gradient for selectively exciting a slice of an examination subject, and which cause an echo signal of the nuclear magnetic resonant signal to be generated, the application of a read gradient disposed perpendicularly relative to the slice selection gradient for reading-out the echo signal, subjecting the echo signal which has been read-out to a Fourier transformation, and displaying the chronological course of the signals acquired in the n successive steps.

DESCRIPTION OF THE PREFERRED EMBODIMENTS

Figure 1:
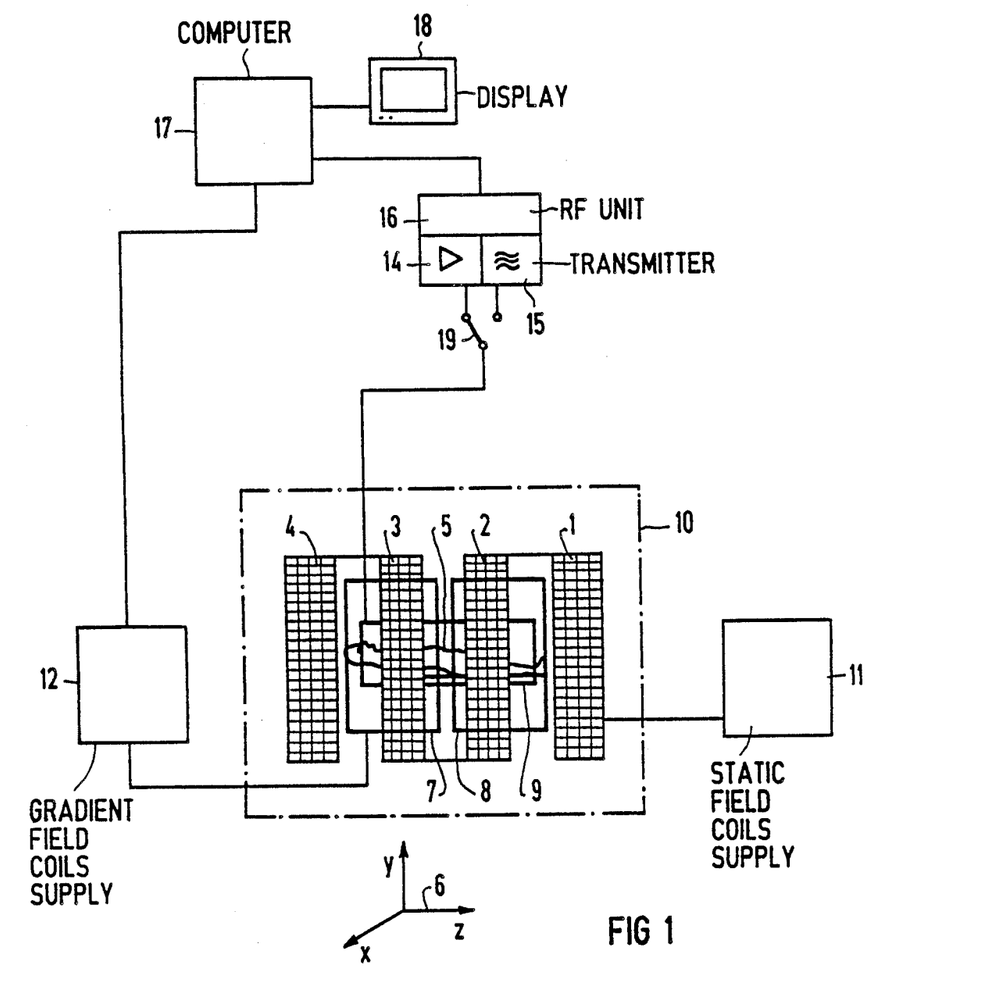
FIG. 1 is a schematic block diagram of a nuclear magnetic resonance tomography apparatus operable in accordance with the method disclosed herein.
Figure 2:
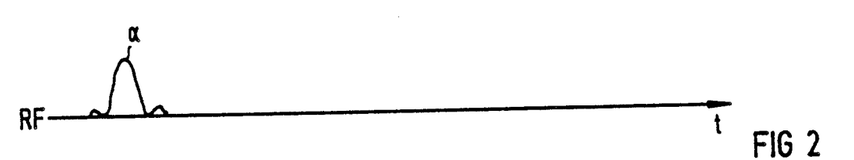
FIGS. 2-5 show a first embodiment of a pulse sequence in accordance with the principles of the present invention.

A nuclear magnetic resonance tomography apparatus which can be operated in accordance with the various embodiments of a pulse sequence in accordance with the principles of the present invention is shown in FIG. 1. The apparatus includes coils 1, 2, 3 and 4 which generate a static magnetic field in which, for medical diagnostic purposes, the body of a patient to be examined is disposed. The apparatus also includes sets of gradient coils for respectively generating independent orthogonal magnetic field components in the x-, y- and z-directions, as defined by the coordinate system 6. For clarity, only the gradient coils 7 and 8 are shown in FIG. 1, which generate an x-gradient in combination with a pair of identical gradient coils (not shown) on the opposite of the patient. A set of y-gradient coils (not shown) are disposed parallel to the body 5 above and below the body 5, and a set of z-gradient coils are disposed at the head and 20 feet of the body 5 transversely relative to the longitudinal axis of the patient.

The apparatus also includes a radio-frequency (RF) coil 9 which both generates and picks-up the nuclear magnetic resonance signals. The coils 1, 2, 3, 4, 7, 8 and 9 bounded by the dot-dash line 10 represent the actual examination instrument.

Also shown in FIG. 1 are electrical components for operating the examination instrument. These include a static field coils supply 11 for the static field coils 1-4, and a gradient field coils supply 12 connected to the coils 7 and 8 as well as to the further gradient coils. The RF coil 9 is coupled to a process computer via an RF unit 16. The RF unit 16 includes a transmitter 15 and a receiver chain including an amplifier 14. A switch 19 is provided which connects the RF coil 9 to the transmitter 15 when the apparatus is operated in a mode for generating RF signals, and for connecting the RF coil 9 to the amplifier 14 when the apparatus is in a pick-up or receive mode. The process computer 17 generates an image from the received nuclear magnetic resonance signals which is portrayed on a display 18.

A first embodiment of a pulse sequence for operating the apparatus of FIG. 1 is shown in FIGS. 2-5. When the flow in a defined vessel, for example, in the aorta or in the vena cava of a patient, is to be evaluated, a slice perpendicular to the primary flow direction within the vessel is first excited with a frequency-selective radio-frequency pulse RF shown in FIG. 2. The radio-frequency pulse RF is made slice-selective by the simultaneous application of a slice selection gradient $G_S$, so that the resonant condition of the Larmor equation is satisfied for only the selected slice, which is perpendicular to the direction of the slice selection gradient $G_S$. The slice selection gradient may be selected in an arbitrary direction by the simultaneous application of gradients in the x-, y- and z-directions.

In all of the embodiments disclosed herein the flow measurement is obtained by impressing an additional phase, perpendicular to the excited slice, on the flow phase $\psi(v, t, G_s(t))$ during the on-time of the slice selection gradient $G_S$. The flow phase is a function of the flow rate v, the time t, and the slice selection gradient $G_s(t)$. Further non-excited spins proceed into the selected layer, this being referred as to "inflow."

The flow phase $\psi(v, t, G_s(t))$ is derived from the following equation:

$$\psi(v, t, G_s(t)) = \gamma \int G_s(t') \cdot t' \cdot v(t') \cdot dt'$$

wherein the symbols are as described above and $\gamma$ is the magnetogyric ratio. When the change in speed is small during the on-time of the slice selection gradient $G_s$, the velocity v can be taken out of the integrand and placed before the integral. The flow phase at a point in time $t_0$ at the conclusion of the slice gradient which is of interest is referred to as $\psi(v, t_0)$ below.

Figures 3, 4, 5:
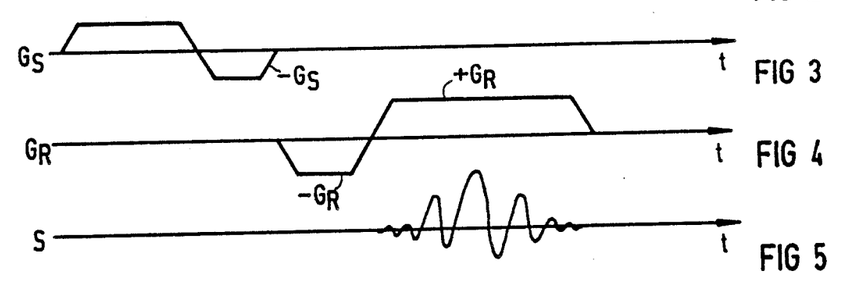
Figure 6:
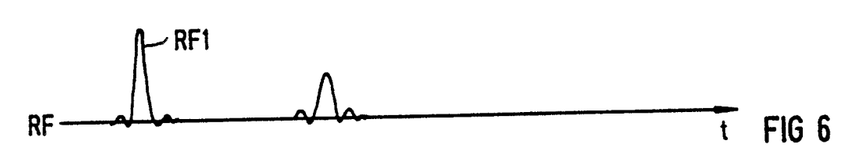
FIGS. 6-10 show a second embodiment of a pulse sequence in accordance with the principles of the present invention.
Figure 7:
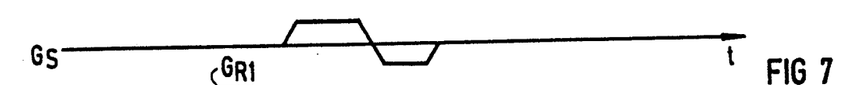
Figure 8:
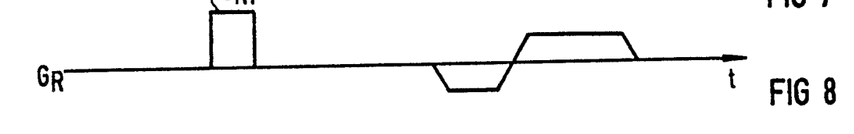
Figure 9:
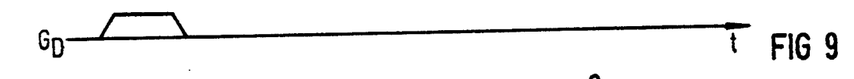
Figure 10:
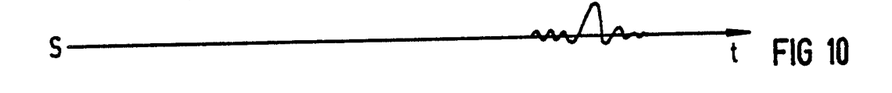
Figure 11:
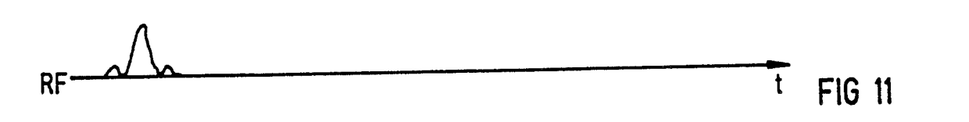
FIGS. 11-17 show a third embodiment of a pulse sequence in accordance with the principles of the present invention
Figure 12:
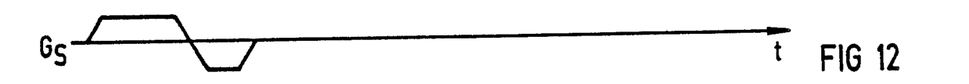

At the end of the radio-frequency pulse RF, the dephasing of the spin system caused by the slice selection gradient Gs is compensated by rephasing, by reversing the slice selection gradient. Subsequently, a negative pre-dephasing gradient $-G_R$ is applied, as shown in FIG. 4. The negative pre-dephasing gradient $-G_R$ is perpendicular to the direction of the slice selection gradient Gs. A dephasing of the spin system in the direction of the negative pre-dephasing gradient $-G_R$ occurs, and by switching to a positive pre-dephasing gradient $G_R$, the spin system is again rephased, so that a spin echo S shown in FIG. 5, arises.

Because the positive read gradient $G_R$ is switched during the read-out of the spin echo S, a locus coding in the direction of this gradient occurs. The envelope of the spin echo signal S is dependent on the geometry of the examination subject 5. The spin echo envelope can be described as F(t) in the stationary condition. The resulting signal is detected with a quadrature detector in a phase-sensitive manner. The following equations are valid for the real part SR(t) of the spin echo signal S(t) and for the imaginary part SJ(t) for the medium which has moved in the direction of the selection gradient Gs with a velocity v:

$$SR(t) = F(t) \cdot \exp(i \cdot \psi(v, t, G_s(t_0))) \text{ and}$$
$$SJ(t) = SR(t) \cdot e^{i\pi/2}.$$

As a consequence of non-excited spins which migrate into the selected layer during the repetition time $T_R$, the magnitude of the spin echo signal varies dependent on the velocity of the flowing medium. This magnitude change also be used for identifying the flow velocity.

The illustrated pulse sequence is repeated an arbitrary number of times, i.e., n times. Although there is a similarity to the conventional spin warp method and to the flash method as described, for example, in European Application 0 191 431, those known methods serve the purpose of generating an image with three-dimensional resolution. In contrast to those known methods, however, the method disclosed herein does not use a phase coding gradient, so that a topical resolution in three dimensions is not obtained using the pulse sequence disclosed herein. To the contrary, the acquired data can be interpreted as a projection in the direction of the otherwise standard phase coding gradient. The topical resolution which would be obtained in the direction of the phase coding gradient which is present in other methods, is exchanged in the pulse sequence disclosed herein, in favor of a chronological resolution of the flow.

Each spin echo which is read out immediately provides flow information. Each spin echo is converted to digital form and is written into a raw data matrix as a line. By Fourier transformation of every line, the flow information can be topically resolved in the direction of the read gradient $G_R$. Care must be taken that a plurality of vessels do not lie behind one another in the direction perpendicular to the read gradient $G_R$ and the slice selection gradient $G_s$ because in that direction no topical resolution is obtained, but instead a projection is obtained.

Generally the spin echo signal consists of signal contributions from the flow in the vessel of interest as well as contributions from tissue disposed above and below vessel in the direction perpendicular to the gradients $G_S$ and $G_R$ because, as noted above, a topical resolution in this direction is foregone. The undesired signal contributions of such stationary tissue can be eliminated with various methods. Under some circumstances, a favorable parameter selection of the repetition time and of the flip angle is sufficient to avoid those undesired signal contributions, since this will cause the blood to be imaged as a liquid having a high contrast to the surrounding tissue. A further possibility for reducing such undesired signal contributions of the stationary tissue is shown in an exemplary embodiment of a further pulse sequence according to the principles of the present invention shown in FIGS. 6-10.

The pulse sequence of FIGS. 6-10 differs from the sequence of FIGS. 2-5 in that a radio-frequency pulse $RF_1$ is initially applied as a saturation pulse. A gradient $G_D$, perpendicular to the gradients $G_s$ and $G_R$ is applied simultaneous with the saturation pulse $RF_1$, so that the saturation pulse $RF_1$ has a selective effect on a slice perpendicular to the direction of the gradient $G_D$. This slice is selected so that the image of the desired vessel is preserved. A condition for this is that the vessel does not make a turn or bend in the direction of the gradient $G_D$. In addition, a spoiler gradient $G_{R1}$ for dismantling the magnetization can be applied.

Figure 13:
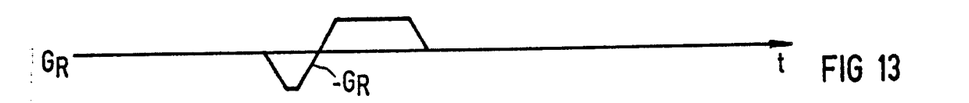
Figure 14:
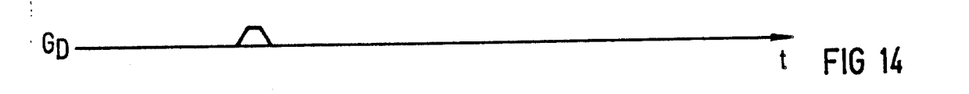
Figure 15:
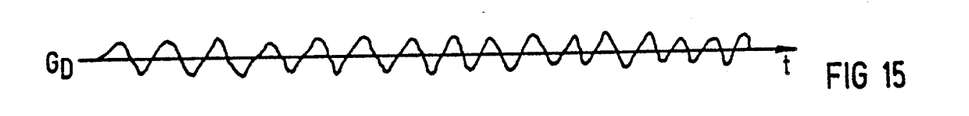
Figure 16:
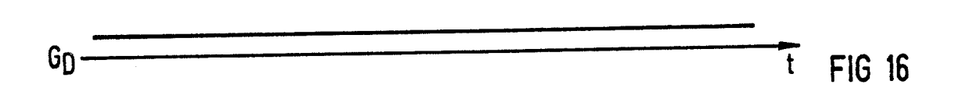
Figure 17:
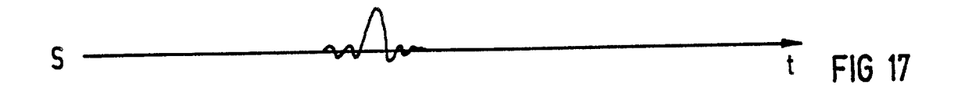
Figure 18:
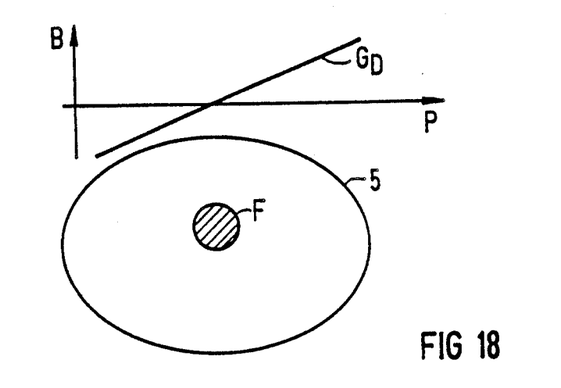
FIG. 18 is a schematic diagram showing the relationship of a gradient applied in the method according to FIGS. 11-17 in relation to the vessel being monitored.

Another embodiment for reducing the signal contributions of stationary tissue is shown in a pulse sequence according to FIG. 11-17. This pulse sequence differs from the sequence of FIGS. 2-5 in that a gradient $G_D$, which is perpendicular to the slice selection gradient $G_s$ and to the read gradient $G_R$, is applied following the slice selection gradient $G_S$, as shown in FIG. 14. In a further modification, an oscillating gradient $G_D$ as shown in FIG. 15 may be applied during the entire pulse sequence. Another possibility if shown in FIG. 16, which is to apply a chronologically constant gradient $G_D$ during the entire pulse sequence. As shown in FIG. 18, the gradient $G_D$ in all of the above modifications, is selected so that the vessel F is disposed in registry with the location at which the gradient $G_D$ crosses the zero line P, i.e., does not influence the static field B. The spins in the tissue outside of the vessel are thus dephased, and thus no longer contribute to the signal.

Figure 19:
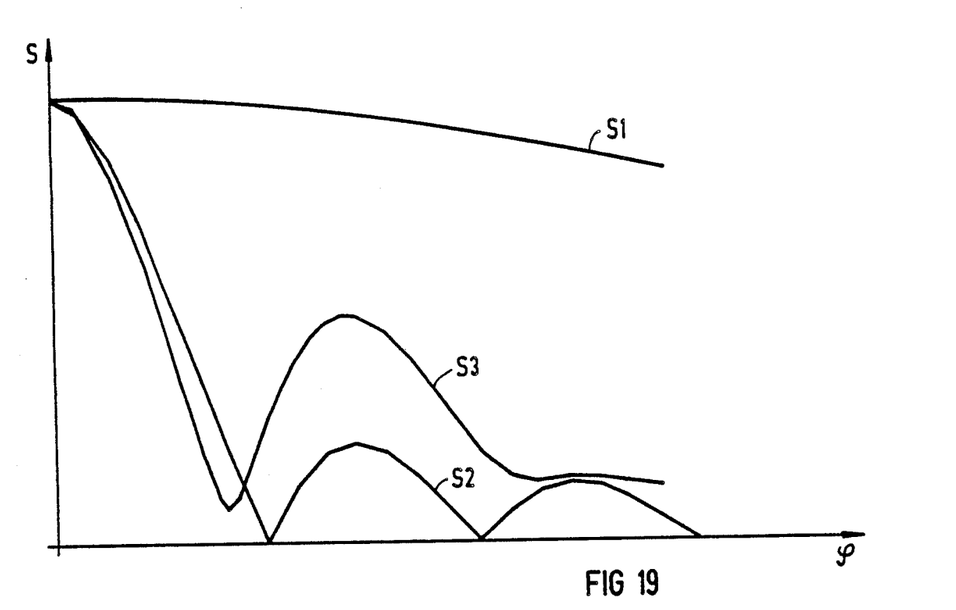
FIG. 19 shows the relationship of nuclear magnetic resonance signals to the phase of a linear gradient as shown in FIG. 18.

FIG. 19 shows the signal attenuation by the linear gradient $G_D$ described immediately above. The course of the signal amplitude S is shown in FIG. 19 over the phase angle $\psi$, which is the phase rotation caused by the gradient $G_D$ over the entire projection. The signal from the vessel F is referenced $S_1$, the signal from the stationary tissue is referenced $S_2$ (a uniform spin density being assumed in this tissue), and a further signal from the stationary tissue is referenced $S_3$ (a non-uniform spin density is assumed in this tissue).

Figure 20:
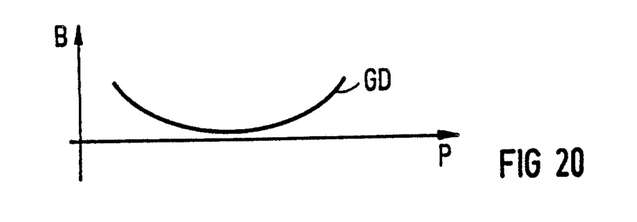
FIG. 20 shows the course of a quadratic gradient.
Figure 21:
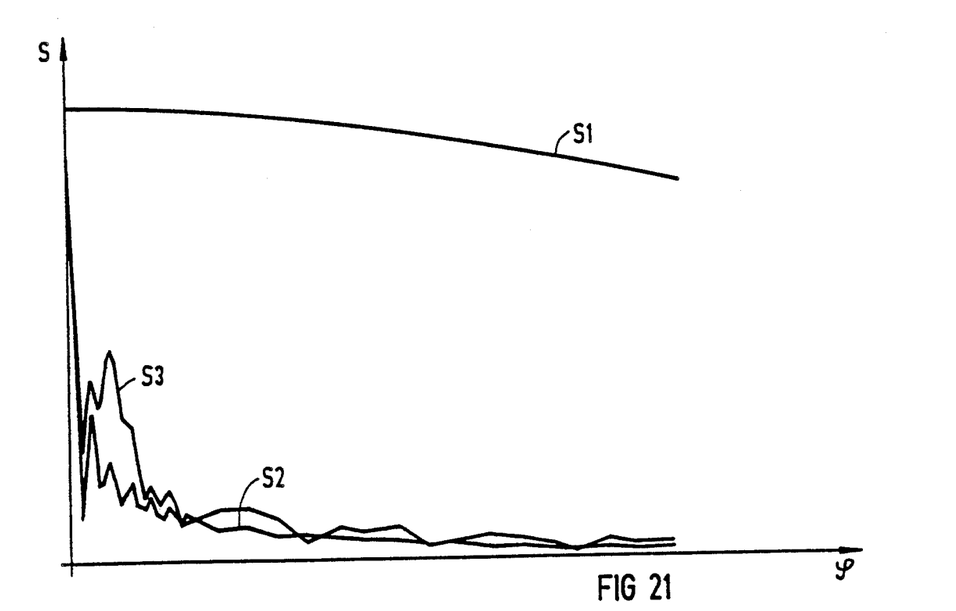
FIG. 21 shows the course of nuclear magnetic resonance signals dependent on the quadratic gradient shown in FIG. 20.

A further reduction of the signal components from the stationary tissue can be achieved if the gradient $G_D$ is not linear, but is a function of a higher order, for example, a quadratic function as shown in FIG. 20. The course of the signals $S_1$ from the vessel and from the stationary tissue ($S_2$ and $S_3$) are shown in FIG. 1, with $S_2$ again identifying the signal path for tissue having uniform spin density and $S_3$ identifying the signal course for tissue having non-uniform spin density.

Figure 22:
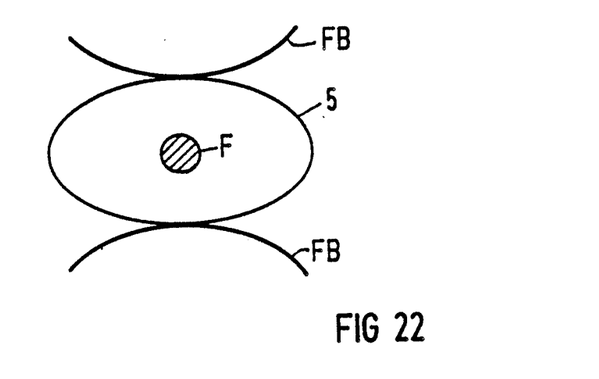
FIG. 22 shows the arrangement of field distorting elements which can be used with any of the embodiments of the invention to reduce signal components from stationary tissue surrounding the vessel under examination.
Figure 23:
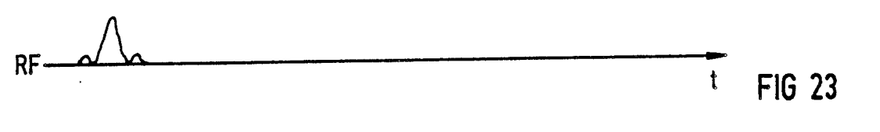
FIGS. 23-28 show a fourth embodiment of a pulse sequence in accordance with the principles of the present invention.
Figure 24:
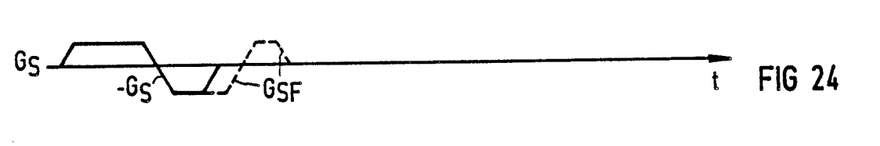

Another way to reduce the signal components from the stationary tissue is shown in FIG. 22, wherein ferromagnetic elements, such as bands FB, are applied to the examination subject 5. The bands FB cause a field distortion outside of the vessel F, so that the spins of nuclei outside of the vessel F are dephased, and their signal contribution is thus reduced.

If the flow being observed has motion components which do not proceed perpendicularly to the selected slice, an additional phase, which may result in a non-negligible error under certain conditions, is generated by the read-out gradient $G_R$ of FIG. 13. It would be theoretically possible to compensate for this error in the mathematical calculation of the flow velocity, however, this would require that the person conducting the examination undertake a measurement of the deviation of the flow direction from the slice normal based on other image information, and the deviation would then have to be specified for entry into the computer.

Instead, because it is possible to orient slices arbitrarily in space, it is usually possible to orient the read-out gradient perpendicularly to a vessel under observation. If, however, flow velocities in a plurality of vessels, which do not proceed parallel to each other, are to be simultaneously measured, a deviation from the slice normal necessarily occurs. Deviations from the slice normal within certain limits, for example 10°, cause only negligibly small errors with the introduction of a flow rephasing gradient $G_{RF}$, in the read-out direction, as described below.

A pulse sequence having such a flow rephasing gradient $G_{RF}$ is shown in FIGS. 23-28. The remainder of the pulse sequence corresponds to that shown in FIGS. 11-17.

Figure 25:
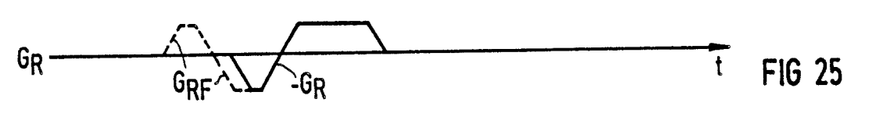
Figure 26:
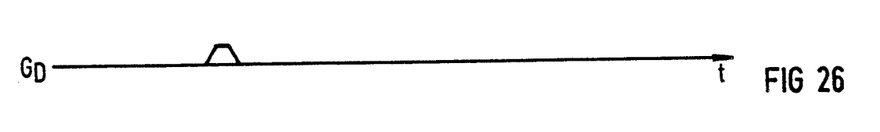
Figure 27:
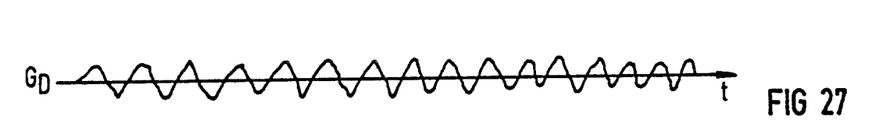
Figure 28:
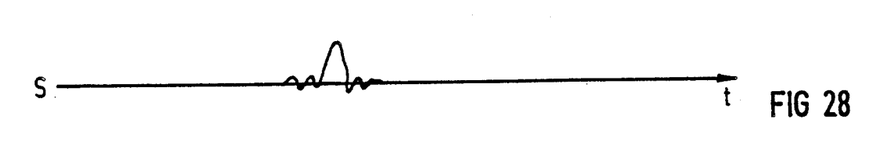

The flow rephasing gradient $G_{RF}$ is a bipolar gradient which, as shown in FIG. 25, precedes the predephasing gradient $-G_R$. The polarity of the flow rephasing gradient $G_{RF}$ changes from positive to negative. The amplitude/time integral over the flow rephasing gradient $G_{RF}$ is zero, so that stationary spins are not influenced. Given a proper selection of amplitude and chronological course of the flow rephasing gradient $G_{RF}$, all spins moving uniformly in the read-out direction are rephased at the echo time, so that a motion in the read-out direction does not cause any additional flow phase, as desired.

The flow rephasing gradient is dimensioned as described in the aforementioned article from Journal of Computer Assisted Tomography, as follows:

$$\phi_v(t) = \gamma v' \int G_R(t') \cdot t' dt' = 0.$$

The negative portion of the flow rephasing gradient $G_{RF}$ may be combined to form one gradient pulse together with the pre-dephasing gradient $-G_R$.

A zero line is needed for evaluating the flow velocity. This can be achieved, for example, by measuring a projection neighboring the vessel to be examined which does not contain any moving spins. Alternatively, as shown in dashed lines in FIG. 24, a flow compensation can be achieved by a bipolar flow rephasing gradient $G_{SF}$ in the slice selection direction which following the rephasing gradient $-G_s$. Again it is required that the amplitude/time integral over the flow rephasing gradient must be zero. The sequence having flow rephasing in the slice selection direction can either precede a complete flow measurement, or may be interleaved therewith, in which case the sequence is then executed with the flow rephasing gradient $G_{SF}$ followed by a sequence without the flow rephasing gradient $G_{SF}$, in alternation.

Figure 29:
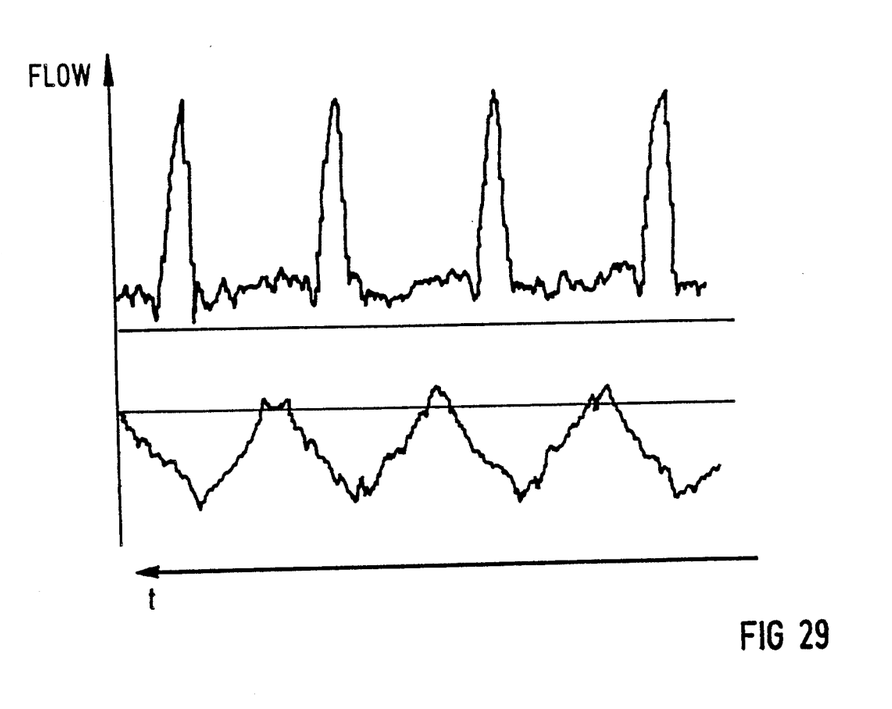
FIG. 29 shows an exemplary chronological course of a vascular flow obtained using the method disclosed herein.

Curves showing the course of vascular flow obtained using the pulse sequences described above are shown in FIG. 29. The upper curve shows the course of blood flow in the aorta, and the lower curve shows the course of blood flow in the vena cava.

Although modifications and changes may be suggested by those skilled in the art, it is the intention of the inventors to embody within the patent warranted hereon all changes and modifications as reasonable and properly come within the scope of their contribution to the art.

We claim as our invention:

1. A method for monitoring the chronological course of a flow in a vessel of an examination subject using the phenomena of nuclear magnetic resonance, comprising the steps of:

selectively exciting nuclear spins in a slice, containing a vessel in which flow is to be monitored, of an examination subject by simultaneously applying a frequency-selective, radio frequency pulse and a slice selection gradient, thereby generating a nuclear magnetic resonant signal;

generating an echo signal of said nuclear magnetic resonant signal;

reading out said echo signal while applying a read-out gradient disposed perpendicularly relatively to said slice selection gradient;

repeating the above steps n times in succession thereby obtaining raw data signals for each repetition; conducting a Fourier transformation of the raw data signals; and and generating a display of said Fourier transformed raw data signals with respect to time as a representation of the chronological course of said flow.

2. A method as claimed in claim 1, wherein the step of generating an echo signal is defined by generating a pre-dephasing gradient preceding said read-out gradient and oriented in an opposite direction from said read-out gradient.

3. A method as claimed in claim 2, wherein the step of generating an echo signal is further defined by generating a bipolar gradient for flow rephasing preceeding said pre-dephasing gradient.

4. A method as claimed in claim 2, wherein said patient is disposed in a static magnetic field, comprising an additional step of generating a dephasing gradient disposed perpendicularly to said slice selection gradient and perpendicularly to said read-out gradient, and the dephasing gradient being zero within a region of interest containing said vessel.

5. A method as claimed in claim 4, wherein the step of generating a dephasing gradient is further defined by generating a dephasing gradient before said pre-dephasing gradient.

6. A method as claimed in claim 4, wherein the step of generating a dephasing gradient is further defined by generating an oscillating dephasing gradient.

7. A method as claimed in claim 4, wherein the step of generating said dephasing gradient is further defined by generating a dephasing gradient having a course defined by a second order or higher equation.

8. A method as claimed in claim 1, comprising the additional step of generating a rephasing gradient following said slice selection gradient and oriented in a direction opposite said slice selection gradient.

9. A method as claimed in claim 8, comprising the additional step of generating a bipolar flow rephasing gradient following said rephasing gradient in at least one repetition of said n repetitions.

10. A method as claimed in claim 1, comprising the additional step of selectively saturating regions of said examination subject outside of said vessel prior to the step of selectively exciting a slice of the examination subject.

11. A method as claimed in claim 1, comprising additional steps of disposing said patient in a static magnetic field, and applying a plurality of ferromagnetic elements to said patient during said n repetitions to distort said static field outside of said vessel to attenuate nuclear magnetic resonance signals outside of said vessel.

* * * * *